United States Patent
Lee (10) Patent No.: US 6,964,904 B2
(45) Date of Patent: Nov. 15, 2005

(54) SEMICONDUCTOR DEVICE AND METHOD FOR MANUFACTURING THE SAME

(75) Inventor: Sang Don Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/734,227

(22) Filed: Dec. 15, 2003

(65) Prior Publication Data

US 2004/0195635 A1 Oct. 7, 2004

(30) Foreign Application Priority Data

Apr. 2, 2003 (KR) .................................. 10-2003-0020765

(51) Int. Cl.⁷ .................. H01L 21/336; H01L 21/8236; H01L 21/3205

(52) U.S. Cl. ................. 438/294; 438/198; 438/275; 438/287; 438/296; 438/299; 438/303; 438/592

(58) Field of Search ................................ 438/592, 294, 438/296, 424, 197, 218, 219, 221, 223, 230, 303, 299, 275, 287

(56) References Cited

U.S. PATENT DOCUMENTS

| | | | | |
|---|---|---|---|---|
| 5,963,818 A | * | 10/1999 | Kao et al. .................... | 438/424 |
| 6,081,662 A | * | 6/2000 | Murakami et al. ............ | 703/14 |
| 6,326,263 B1 | * | 12/2001 | Hsieh .......................... | 438/257 |
| 6,645,798 B2 | * | 11/2003 | Hu ............................... | 438/197 |
| 2002/0052085 A1 | * | 5/2002 | Hwang et al. .............. | 438/283 |
| 2004/0051153 A1 | * | 3/2004 | Yamamoto et al. ......... | 257/412 |

* cited by examiner

Primary Examiner—Ha Nguyen
Assistant Examiner—Cheung Lee
(74) Attorney, Agent, or Firm—Heller Ehrman LLP (57) ABSTRACT

The present invention discloses method for manufacturing semiconductor device employing an EXTIGATE structure. In accordance with the method, a predetermined thickness of the device isolation film is etched to form a recess. The recess is then filled with a second nitride film. A stacked structure of a barrier metal film, a metal layer and a third nitride film on the second nitride film and the polysilicon film is formed on the entire surface and the etched via a photoetching process to form a gate electrode. An insulating film spacer is deposited on a sidewall of the gate electrode. The exposed portion of the polysilicon film using the third nitride film pattern and the insulating film spacer as a mask to form a polysilicon film pattern and an oxide film on a sidewall of the polysilicon film pattern.

6 Claims, 7 Drawing Sheets

SEMICONDUCTOR DEVICE AND METHOD FOR MANUFACTURING THE SAME

BACKGROUND OF THE INVENTION

1. Field of the Invention

The present invention relates to method for manufacturing semiconductor device, and in particular to an improved method for manufacturing Metal-Oxide-Semiconductor Field Effect Transistor ("MOSFET") employing tungsten gate wherein the oxidation of barrier metal film and metal layer is prevented using EXtended Trench Isolation GATE ("EXTIGATE") structure to improve yield and reliability of the device.

2. Description of the Background Art

As the integration density of a semiconductor device is increased, the size of each device is decreased. In order to reduce of the size of the device, overall design rule for a gate electrode, a source/drain region or contacts thereof of MOSFET is decreased. The width of the gate electrode is inversely proportional to electrical resistance such that when the width of the gate electrode is decreased by 1/n times, the electrical resistance thereof is increased by n times. The increase in the electrical resistance reduces the operating speed of the semiconductor device. One of the methods proposed for reducing the electrical resistance of the gate electrode is using a polycide which is a stacked structure of a polysilicon and a silicide having stable interface characteristics for the gate electrode.

FIGS. 1a through 1e are cross-sectional diagrams illustrating a conventional method for manufacturing semiconductor device including an EXTIGATE MOSFET.

Figure 1A:
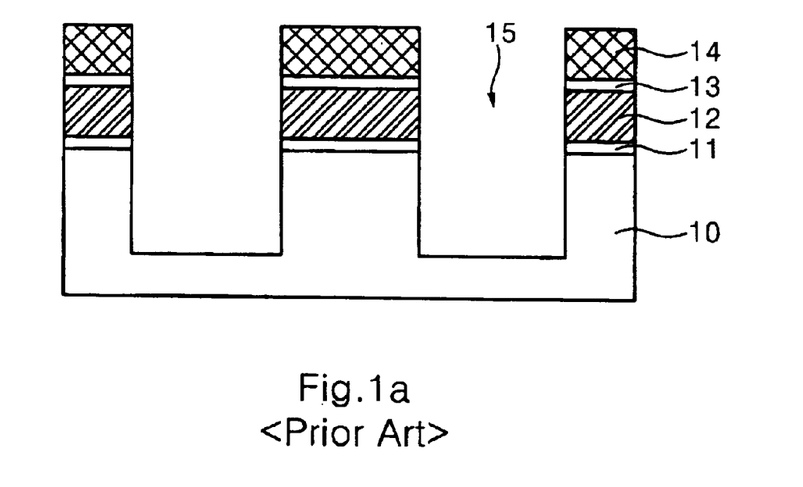
FIGS. 1a through 1e are cross-sectional diagrams illustrating a conventional method for manufacturing semiconductor device including an EXTIGATE MOSFET.

Referring to FIG. 1a, a gate oxide film (not shown), a polysilicon film (not shown), an intermediate oxide film (not shown) and a first nitride film (not shown) are sequentially deposited on a semiconductor substrate 10. The first nitride film, the intermediate oxide film, the polysilicon film and the gate oxide film are patterned via a photo-etching process using a device isolation mask to form a stacked structure of a gate oxide film pattern 11, a polysilicon film pattern 12, a intermediate oxide film 13 and a first nitride film pattern 14 exposing device isolation region of the semiconductor substrate 10. Thereafter, the exposed portion of the semiconductor substrate 10 is etched by a predetermined depth to form a trench 15.

Figure 1B:
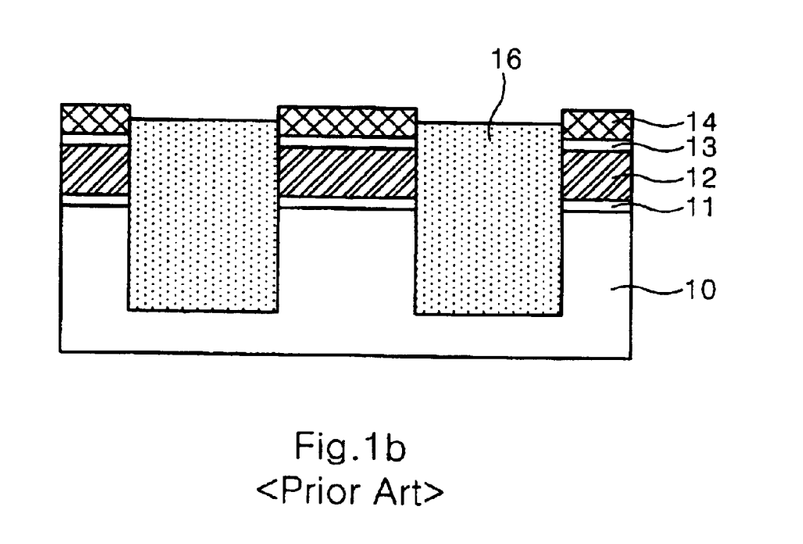

Referring to FIG. 1b, an oxide film for device isolation film is deposited on the entire surface of the structure. The oxide film for device isolation film is then planarized via a chemical mechanical polishing ("CMP") process until the first nitride film pattern 14 is exposed to form a device isolation film 16.

Figure 1C:
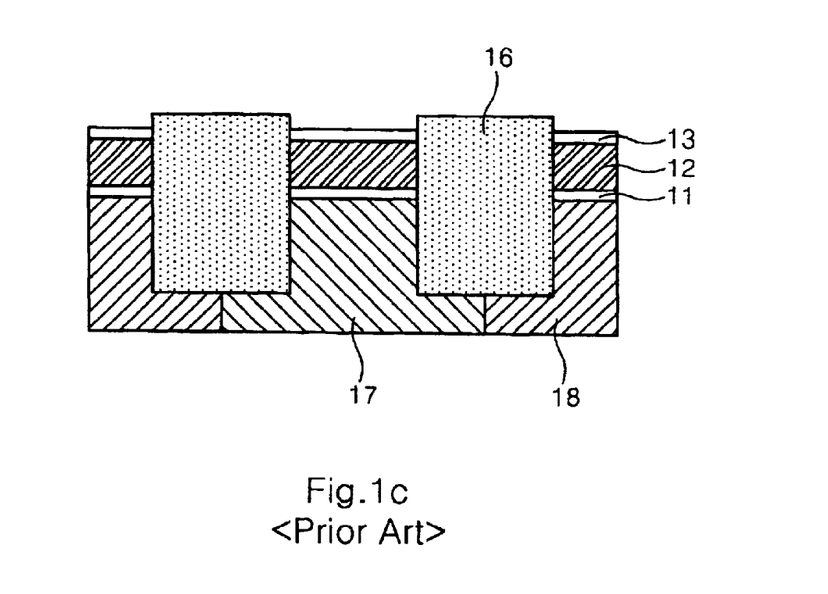

Now referring to FIG. 1c, the first nitride film pattern 14 is removed. A p-well 17 and an n-well 18 are formed in predetermined regions of the semiconductor substrate 10 via an ion implant process using a well mask and a drive-in process.

Figure 1D:
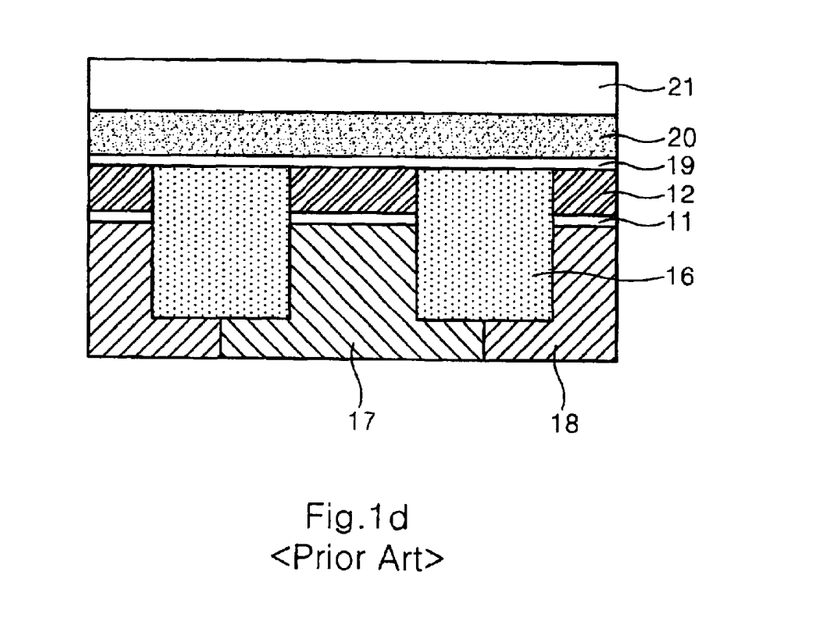

Referring to FIG. 1d, the entire surface is planarized to expose the polysilicon film pattern 12. A barrier metal film 19, a metal layer 20 and a second nitride film 21 are sequentially formed on the entire surface of the structure.

Figure 1E:
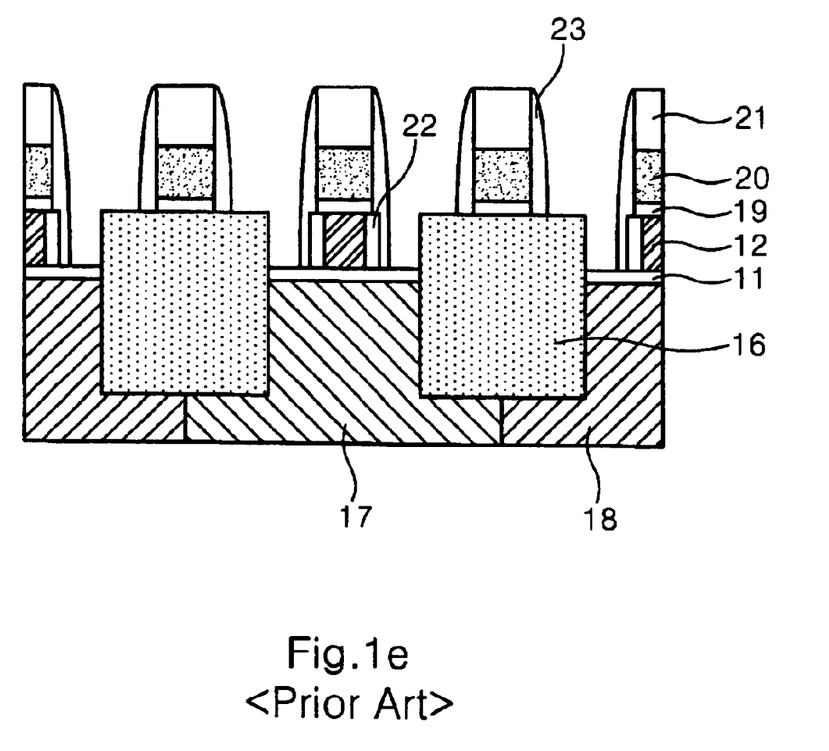

Referring to FIG. 1e, the second nitride film 21, the metal layer 20, the barrier metal film 19 and the polysilicon film pattern 12 are patterned via a photoetching process using a word line mask to form a gate electrode. Thereafter, an oxide film 22 is formed on a sidewall of the polysilicon film pattern 12. A nitride film (not shown) is then formed on the entire surface and etched back to form an insulating spacer 23.

Thereafter, although not shown, subsequent processes such as formation process pf a source/drain region are performed.

In accordance with the above-described method for manufacturing semiconductor device including the EXTIGATE MOSFET, although the method was proposed to overcome the disadvantage of a conventional Shallow Trench Isolation ("STI") method, voids are generated during the deposition process of oxide film for device isolation film due to a large step difference between the trench and the first nitride film. In addition, since the barrier metal film and the metal layer are deposited directly on the device isolation film, oxidation occurs, thereby increasing the resistance of the gate electrode. Moreover, the exposure of the barrier metal film and the metal layer during the oxidation of the sidewall of the polysilicon film pattern accelerates the oxidation of the barrier metal film and the metal layer, resulting in insufficient thickness of the oxide film on the sidewall to cause electrical short between layer during subsequent processes. These disadvantages result in degradation of the yield and reliability of the device.

SUMMARY OF THE INVENTION

Accordingly, it is an object of the present invention to provide a semiconductor device and method for manufacturing the same wherein voids in the device isolation film are prevented by reducing the thickness of the first nitride film, and a oxide film having a sufficient thickness can be formed by preventing the exposure of the barrier metal film and the metal layer, thereby preventing the increase in electrical resistance and the electrical short to improve the yield and reliability of the device.

In order to achieve the above-described object of the invention, there is provided a method for manufacturing semiconductor device comprising the steps of: sequentially forming a gate oxide film, a polysilicon film and a first nitride film on a semiconductor substrate; etching the first nitride film, polysilicon film, gate oxide film and a predetermined depth of the semiconductor substrate to form a trench; forming a device isolation film to define an active region by filling up the trench; removing the first nitride film; etching a predetermined thickness of the device isolation film to form a recess; forming a second nitride film filling the recess; forming a stacked structure of a barrier metal film, a metal layer and a third nitride film on the second nitride film and the polysilicon film; etching the stacked structure and the second nitride film pattern via a photoetching process using a gate line mask to form a gate electrode comprising a stacked structure of second nitride film pattern, a barrier metal film pattern, a metal layer pattern and a third nitride film pattern; forming a insulating film spacer on a sidewall of the gate electrode; etching the polysilicon film using the third nitride film pattern and the insulating film spacer as a mask to form a polysilicon film pattern; and forming an oxide film on a sidewall of the polysilicon film pattern.

There is provided a semiconductor device including a device isolation film defining an active region, the device further comprising a gate electrode, wherein a portion of the gate electrode on the active region comprises a stacked structure of nitride film-barrier metal film-metal layer-nitride film, and a portion of the gate electrode on the device isolation film comprises a stacked structure of polysilicon film-barrier metal film-metal layer-nitride film.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for manufacturing semiconductor device including an EXTIGATE MOSFET in accordance with a preferred embodiment of the present invention will now be described in detail with reference to the accompanying drawings.

FIGS. 2a through 2g are cross-sectional diagrams illustrating a method for manufacturing semiconductor device including an EXTIGATE MOSFET in accordance with the present invention.

Figure 2A:
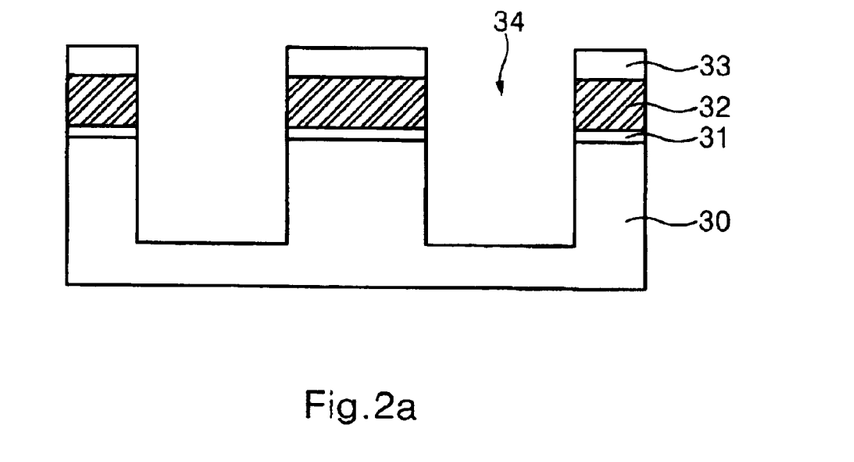
FIGS. 2a through 2g are cross-sectional diagrams illustrating a method for manufacturing semiconductor device including an EXTIGATE MOSFET in accordance with the present invention.

Referring to FIG. 2a, a gate oxide film (not shown), a polysilicon film (not shown) and a first nitride film (not shown) are sequentially deposited on a semiconductor substrate 30. The first nitride film, the polysilicon film and the gate oxide film are patterned via a photoetching process using a device isolation mask to form a stacked structure of a gate oxide film pattern 31, a polysilicon film pattern 32 and a first nitride film pattern 33 exposing device isolation region of the semiconductor substrate 30. It is preferable that the first nitride film has a thickness ranging from 10 to 70 nm. Thereafter, the exposed portion of the semiconductor substrate 30 is etched by a predetermined depth to form a trench 34.

Figure 2B:
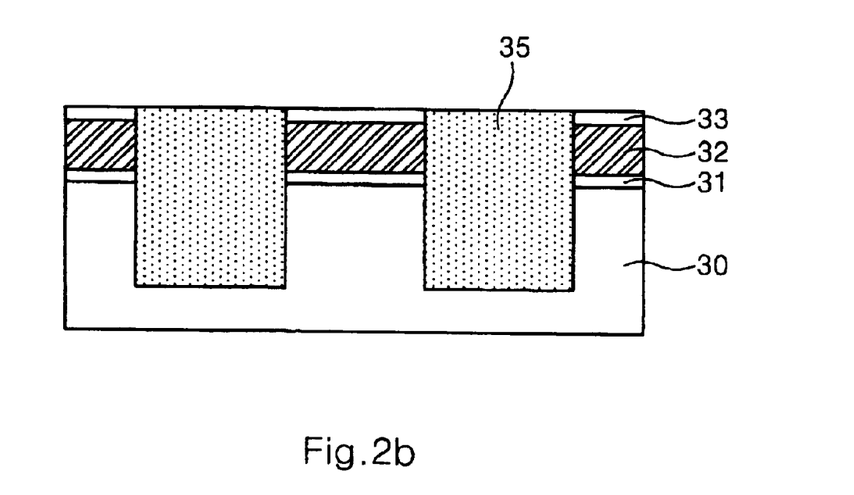

Referring to FIG. 2b, an oxide film for device isolation film (not shown) is deposited on the entire surface of the structure to fill up the trench 34. The oxide film for device isolation film is then planarized via a CMP process until the first nitride film pattern 33 is exposed to form a device isolation film 35.

Figure 2C:
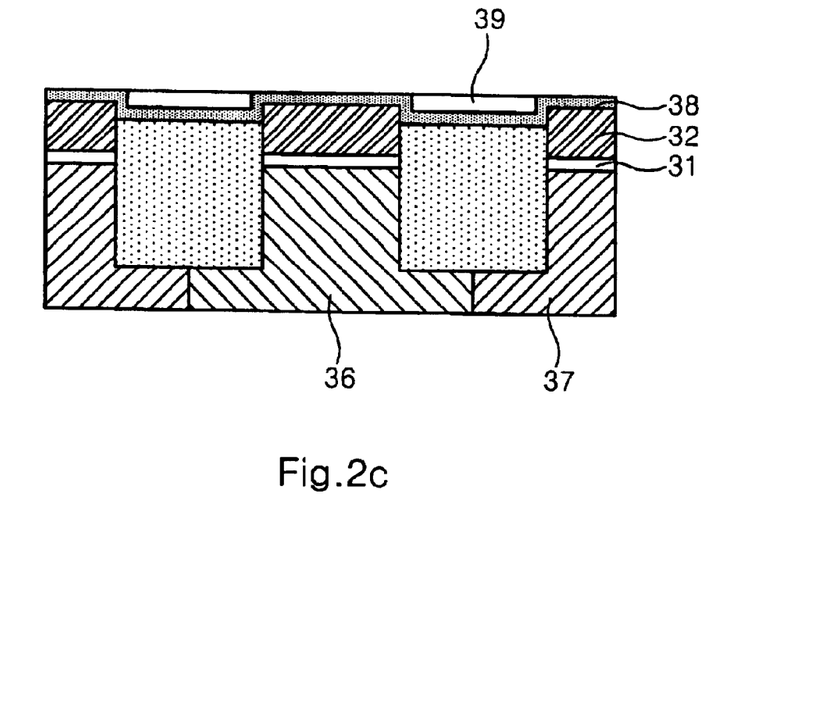

Now referring to FIG. 2c, a p-well 36 and an n-well 37 are formed in predetermined regions of the semiconductor substrate 30 via an ion implant process using a well mask and a drive-in process. The first nitride film pattern 33 is then removed. Thereafter, a portion of the device isolation film 35 protruding above the polysilicon film pattern 32 is etched via a wet etching process to form a recess. A depth of the recess ranges from 20 to 100 nm. A conformal second nitride film 38 having a thickness ranging from 10 to 90 nm and a sacrificial oxide film (not shown) are sequentially formed on the entire surface and then planarized via a CMP process until the second nitride film 38 is exposed to form a sacrificial oxide film pattern 39.

Figure 2D:
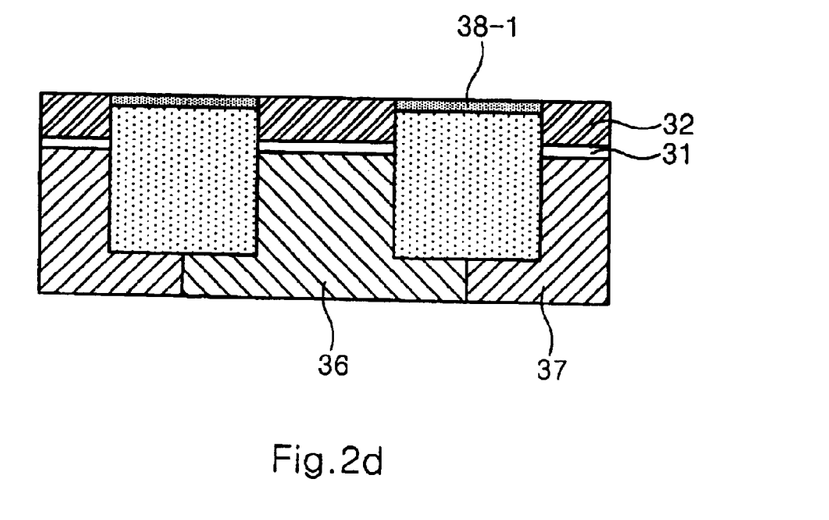

Referring to FIG. 2d, a portion of the second nitride film 38 on the polysilicon film pattern 32 and the sacrificial oxide film pattern 39 on the device isolation film 35 are removed, preferably by a CMP process, to form a second nitride film pattern 38-1 on the device isolation film 35.

Figure 2E:
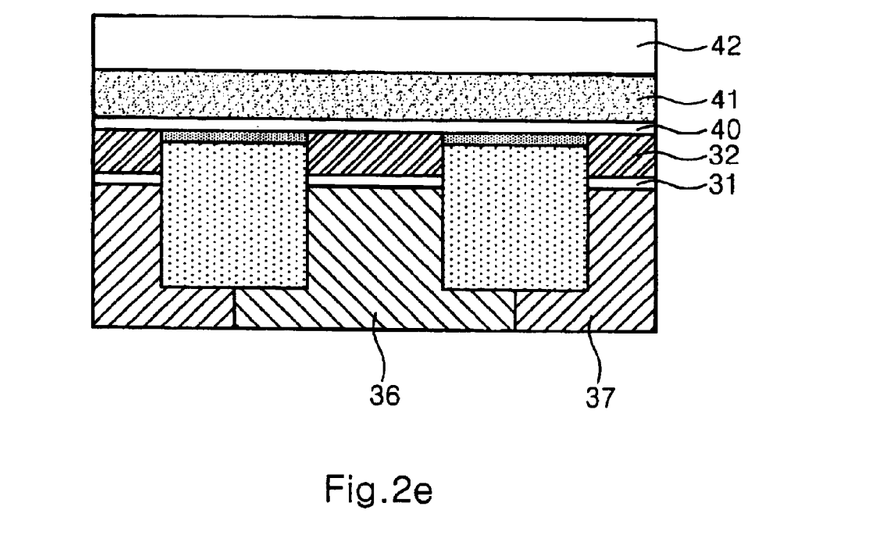

Now referring to FIG. 2e, a barrier metal film 40, a metal layer 41 and a third nitride film 42 are sequentially deposited on the entire surface of the structure. Preferably, the barrier metal film 40 comprises a metal selected from the group consisting of WN, TiN and TiSiN, and the metal layer 41 comprises a metal selected from the group consisting of tungsten, titanium silicide, tungsten silicide and cobalt silicide.

Figure 2F:
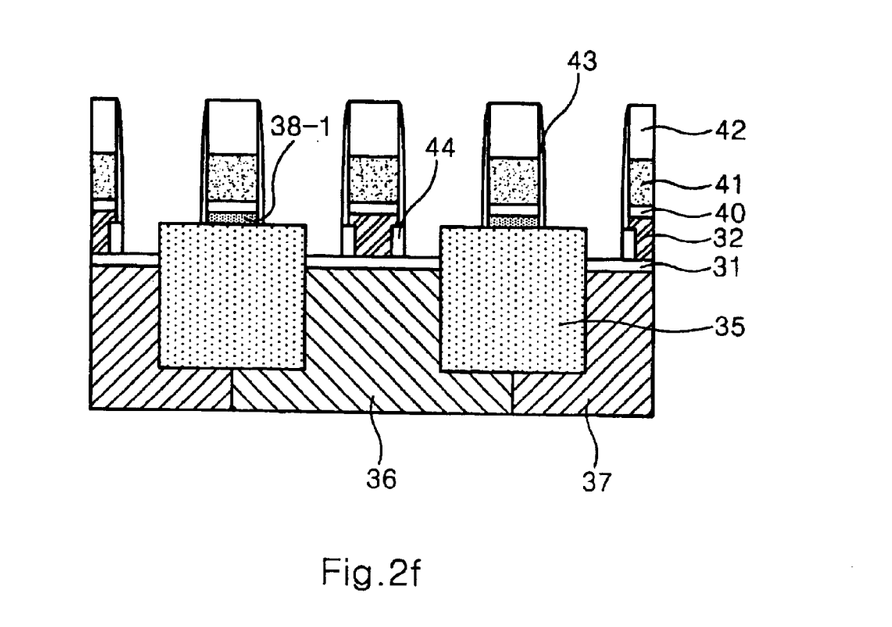

Referring to FIG. 2f, the third nitride film 42, the metal layer 41, the barrier metal film 40 and the second nitride film pattern 38-1 are patterned via a photoetching process using a word line mask to form a stacked structure of the second nitride film pattern 38-1, the barrier metal film 40, the metal layer 41 and the third nitride film 42. Thereafter, an insulating film such as a nitride film (not shown) is deposited on the entire surface of the structure and then etched back to form an insulating film spacer 43 on a sidewall of the stacked structure. Next, a exposed portion of the polysilicon film pattern 32 between the stacked structure and the device isolation film 35 is etched using the stacked structure and the insulating film spacer 43 as a mask until the gate oxide film pattern 31 is exposed to form a gate electrode comprising a stacked structure of the polysilicon film pattern 32, the barrier metal film 40, the metal layer 41 and the third nitride film 42. A portion of the gate electrode on the device isolation film comprises a stacked structure of nitride film-barrier metal film-metal layer-nitride film, and a portion of the gate electrode on the active region comprises a stacked structure of polysilicon film-barrier metal film-metal layer-nitride film.

Thereafter, an oxide film 44 is selectively grown on a sidewall of the polysilicon film pattern 32. Since the insulating film spacer 43 protects the barrier metal film 40 and the metal layer 41, the oxide film can be grown to have a sufficient thickness.

Figure 2G:
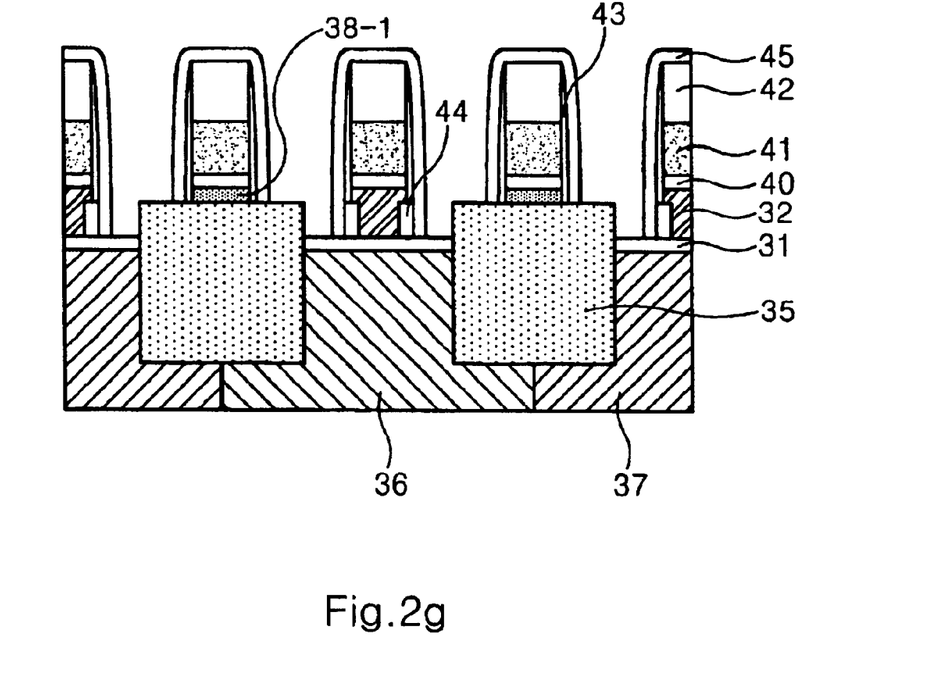

Referring to FIG. 2g, a fourth nitride film 45 is deposited on the entire surface and then etched to expose the gate oxide film pattern 31. The fourth nitride film 45 may serve as an etching barrier during the self-align contact ("SAC") process or as a spacer during an etch-back process.

As discussed earlier, in accordance with the present invention, the thickness of the first nitride film on the polysilicon film pattern may be reduced to prevent voids due to large step difference. In addition, the insulating film spacer protects the barrier metal film and the metal layer to prevent oxidation thereof and to allow growth of the oxide film having a sufficient thickness on the sidewall of the polysilicon film pattern, thereby reducing the resistance of the gate electrode and the electrical short between layer.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for manufacturing semiconductor device, the method comprising the steps of:

sequentially forming a gate oxide film, a polysilicon film and a first nitride film on a semiconductor substrate;

etching the first nitride film, polysilicon film, gate oxide film and a predetermined depth of the semiconductor substrate to form a trench;

forming a device isolation film by filling up the trench to define an active region;

removing the first nitride film;

etching a predetermined thickness of the device isolation film to form a recess;

forming a second nitride film filling the recess;

forming a stacked structure of a barrier metal film, a metal layer and a third nitride film on the second nitride film and the polysilicon film;

etching the stacked structure and the second nitride film via a photoetching process using a gate line mask to form a gate electrode comprising a stacked structure of second nitride film pattern, a barrier metal film pattern, a metal layer pattern and a third nitride film pattern;

forming an insulating film spacer on a sidewall of the gate electrode;

etching the polysilicon film using the third nitride film pattern and the insulating film spacer as a mask to form a polysilicon film pattern; and forming an oxide film on a sidewall of the polysilicon film pattern.

2. The method according to claim 1, wherein the step of forming a second nitride film comprises:

forming a nitride layer having a predetermined thickness on the entire surface of the polysilicon film and within the recess;

forming a sacrificial oxide film on the entire nitride layer filling the recess;

performing planarization to expose the nitride layer; and removing the sacrificial oxide film to form the second nitride film.

3. The method according to claim 1, wherein the first nitride film has a thickness ranging from 10 to 70 nm.

4. The method according to claim 1, wherein the depth of the recess ranges from 20 to 200 nm.

5. The method according to claim 1, wherein the second nitride film has a thickness ranging from 10 to 90 nm.

6. The method according to claim 1, wherein the barrier metal film comprises a metal selected from the group consisting of WN, TiN and TiSiN, and the metal layer comprises a metal selected from the group consisting of tungsten, titanium silicide, tungsten silicide and cobalt silicide.

* * * * *